United States Patent [19]
Senge et al.

[11] Patent Number: 6,129,830
[45] Date of Patent: Oct. 10, 2000

[54] PROCESS FOR THE ELECTROLYTIC DEPOSITION OF COPPER LAYERS

[75] Inventors: Gerd Senge; Wolfgang Dahms, both of Berlin, Germany

[73] Assignee: Atotech Deutschland GmbH, Germany

[21] Appl. No.: 09/319,423

[22] PCT Filed: Dec. 4, 1997

[86] PCT No.: PCT/EP97/06786

§ 371 Date: Jun. 2, 1999

§ 102(e) Date: Jun. 2, 1999

[87] PCT Pub. No.: WO98/26114

PCT Pub. Date: Jun. 18, 1998

[30] Foreign Application Priority Data

Dec. 13, 1996 [DE] Germany .......................... 196 53 681

[51] Int. Cl.$^7$ ................ C25D 5/18; C25D 5/02
[52] U.S. Cl. ........................................ 205/104; 205/125
[58] Field of Search ..................................... 205/104, 125

[56] References Cited

FOREIGN PATENT DOCUMENTS

| | | |
|---|---|---|
| 9011119 | 6/1990 | European Pat. Off. . |
| 215 589 | 11/1984 | Germany . |
| 261 613 | 11/1988 | Germany . |
| 43 44 387 | 6/1995 | Germany . |
| 07242396 | 8/1995 | Japan . |
| 662217 | 12/1991 | United Kingdom . |
| PCT/GB89/00042 | 1/1989 | WIPO . |

OTHER PUBLICATIONS

"Pulse Plating of Copper for Printed Circuit Board Technology", Metal Finishing Apr. 21–21, 1991. M.R. Kalantary and D.R. Gabe, Loughborough University of Technology, Leicestershire, England and M. Goodenough, Lea Ronal (UK) Ltd. Buxton, England. See p. 3, paragraph 2 of the specification.

*Primary Examiner*—Kathryn Gorgos
*Assistant Examiner*—Erica Smith-Hicks
*Attorney, Agent, or Firm*—Paul & Paul

[57] ABSTRACT

A process with the following process steps is used to electrolytically deposit copper layers, especially on printed circuit boards. An electrically-conductive substrate and anodes that decompose upon electrolytic deposition are brought into contact with a deposition bath. The deposition bath contains copper ions, compounds that increase the electrical conductivity of the deposition bath, additives to influence the material properties of the copper layers, additional compounds of an electrochemically reversible redox system, and solvents or solvent mixtures. The substrate and the electrodes are connected to a power supply. The copper layers are deposited on the substrate using a pulsed current or a pulsed voltage process. When this process is used, metal layers with favorable visual and mechanical material properties are deposited after a brief bath preparation time.

13 Claims, No Drawings

PROCESS FOR THE ELECTROLYTIC DEPOSITION OF COPPER LAYERS

The invention concerns a process to electrolytically deposit copper layers within a short preparation time, especially in the manufacture of printed circuit boards.

There are various requirements for copper deposits on printed circuit boards: On the one hand, the copper layers must satisfy certain requirements regarding material properties. For example, they cannot form any cracks when subject to thermal shock (immersed at least once for 10 sec. in liquid tin/lead solder at 288° C.). In addition, the copper layers must be bright, smooth, and as uniformly thick as possible at all locations of the coated surfaces. In addition, the deposition procedure must be easy to manage and economical.

Copper anodes that decompose during electrolytic deposition are normally used in electrolytic copper deposition. These anodes are in the form of plates, bars or spheres. The plates and bars are connected to the power supply with suitable fastening means. The spheres come in specially-made baskets that usually consist of titanium, and these are connected to the power supply with suitable fastening means.

Since these anodes decompose at approximately the same rate during deposition as the copper is deposited from the deposition bath, the amount of copper in the deposition solution remains approximately constant. It is therefore unnecessary to replenish the deposited copper.

The electrolytically deposited layers are given specific material properties by feeding slight amounts of additives to the deposition bath. These are primarily organic substances, small amounts of which are usually consumed under the deposition conditions set for manufacturing printed circuit boards. To maintain the specified qualities, the lost organic additives are correspondingly replenished. However, the additives only slightly improve the throwing power, i.e., the uniform thickness of the copper layer on all the coated surfaces.

Another type of anode is the insoluble anode whose exterior dimensions do not change during the deposition process. These anodes consist of inert metals such as titanium or lead that can be coated with catalytic metals such as platinum to prevent high anodic overvoltages.

When insoluble anodes are used, suitable measures must be taken to maintain the copper ion concentration in the deposition bath, such as adding suitable solutions that contain the copper ions in a concentrated form. A recently-suggested option is to replenish the copper ions by chemically dissolving copper components in a separate treatment container by adding iron(III) ions or other metal ions that oxidize copper (DD 215 589 B5, DD 261 613 A1, DE-P 43 44 387 A1). The iron(II) ions formed by dissolving the copper are reoxidized at the anodes into iron(III) ions, and the solution enriched with copper ions is fed to the substrate to deposit the copper. A stationary equilibrium of the copper ion concentration is set by continuously circulating the deposition solution between the deposition container and the treatment container that contains the copper components. The added iron ions also suppress the oxidative decomposition of the organic compounds that are added to control the material properties of the deposited copper layers. If the baths with insoluble anodes are used without these ions, the compounds decompose very quickly, and useful metal layers cannot be obtained at all.

The process that uses insoluble anodes is complicated and, to maintain the copper ion concentration, requires precise settings for the iron ion concentration, the deposition solution circulation speed, the surface of the copper components and their morphology and other parameters in relation to the selected copper deposition flow. In addition, the additives added to the deposition bath to influence the material properties of the copper layers can decompose at the insoluble anodes if conditions are wrong so that the material properties cannot be reliably attained. In addition, it has also been observed that adding the iron ions harms the uniformity of the copper layer thickness on the outside of the printed circuit boards and the lateral surfaces of the drilled holes under the conditions cited in the above-mentioned documents. It is therefore preferable to use a process with soluble anodes.

If a pulsed-current or a pulsed-voltage process is used (pulse plating) instead of direct current, the throwing power is usually improved (WO A 89/07162, "Pulse Plating of Copper for Printed Circuit Board Technology", M. R. Kalantary, D. R. Gabe, M. Goodenough, *Metal Finishing,* 1991, p. 21–27). In depositing copper on printed circuit boards, sufficiently thick metal layers are obtained particularly in small drilled holes even the local current density at the holes is low.

A disadvantage is that, after the bath is created, only rough copper can be obtained during deposition (some of which has a dendrite structure) even though organic additives were added to improve the material properties of the copper layers. The surfaces of such deposited layers are rough and dull and irregularly mottled. In addition, the ductility of these layers is very low so that cracks form upon thermal shock, e.g. from soldering in the copper layer.

After a new bath is created, the situation will improve after a long while, yet during this time, the copper is continuously being deposited from the bath, and the bath components are continuously being refreshed corresponding to normal consumption. This can take 7–14 days or even longer depending on the utilization of the bath at a required current flow of 50–100 A×h/l ("Analytik von sauren Kupferbädern", B. Bressel, *Galvanotechnik,* 76 (1985), p. 1972). During this period, the printed circuit boards have such unsatisfactory visual and mechanical properties that they are useless. Substantial costs arise from the long deposition bath preparation period.

The invention is therefore based on the problem of finding a process that avoids the disadvantages of the prior-art processes and especially that is economical. The deposited copper layers should be as uniformly thick as possible at all sites of the coated surface and have sufficiently favorable visual and mechanical properties (such as brightness, elongation at break, and tensile strength). It should also be possible to manufacture layers that are approximately 25 $\mu$m both on the outside and in drilled holes of printed circuit boards that can endure multiple, 10 sec. immersions in a 288° C. solder bath without cracking. The cited features should be attainable after a very short deposition period (short preparation phase) after preparing the bath, e.g. after a charge exchange of less than 10 A×h/l (ampere hours/liter), and preferably less than 1 A×h/l.

It was shown that the preparation time of a deposition bath containing copper ions, at least one compound that influences the material properties of the deposited metal, and at least one solvent or solvent mixture (i.e., the period in which useful copper layers cannot be deposited from the deposition bath after a new bath is made) can be drastically shortened by using at least one soluble anode, e.g. of copper, and a pulsed-current or pulsed-voltage plating process. Useful layers can be obtained after a charge exchange of 10

A×h/l and preferably 5 A×h/l when small amounts of iron ions are added to the deposition solution. Under these conditions, frequently less than 1 A×h/l is required to prepare the bath to attain a good copper coating on the printed circuit boards. The preparation time can be completely eliminated in certain cases.

It is conjectured that the reason behind the unexpected effect from adding iron ions is the catalytic effect of these ions on the oxidation of the organic sulfur compounds used as brighteners that are normally added to the deposition bath and are reduced at the cathode.

The effect according to the invention is also observed when compounds of other redox system are present in slight amounts. In addition to iron compounds, compounds of the following elements are also useful: arsenic, cerium, chromium, cobalt, gold, manganese, molybdenum, platinum, ruthenium, samarium, titanium, vanadium, tungsten and tin.

To solve the problem according to the invention, it is sufficient to add the cited compounds at a concentration of 3–500 mg/l and preferably 25–100 mg/l to the deposition bath. These concentrations refer to the amount of the cited element in the compound in the deposition bath.

It is preferable to add an iron compound to the bath. It does not matter whether iron(II) or iron(III) is mixed in the bath. After a short operating time, an equilibrium arises of the iron(II) or iron(III) compounds added to the bath.

If the normal brighteners, wetting agents and other conventional additives are then added to the electrolyte as described in the following, the preparation time is drastically reduced or eliminated when pulsed currents are used. The additives prevent the formation of roughness and dull copper surfaces. In addition, the copper layers deposited from these baths survive multiple solder shock tests (10 sec. at 288° C.) without crack formation. The process also has the advantage that the deposited copper layers are uniformly thick at all sites of the coated surfaces as opposed to layers created by prior-art processes in which iron ions are added to the copper bath.

Possible compounds that can be used to produce the effect according to the invention are: Acetates, bromides, carbonates, chlorides, fluorides, sulfates, tetrafluoroborates, phosphates, perchlorates, citrates, fumarates, gluconates, methane sulfonates and oxalates of iron(II) or iron(III) ions, or compounds of the other previously-cited elements.

Iron compounds according to the invention are listed in Table 1.

Other compounds that were successfully tested are listed in Table 2. Their use is limited by their high cost, however.

The basic composition of the copper bath can vary widely. In general, an aqueous solution is used with the following composition:

| Copper sulfate ($CuSO_4 \cdot 5H_2O$) | 20–250 g/l |
|---|---|
| preferably | 80–140 g/l or |
|  | 180–220 g/l |
| Sulfuric acid | 50–350 g/l |
| preferably | 180–280 g/l or |
|  | 50–90 g/l |
| Chloride ions | 0.01–0.18 g/l |
| preferably | 0.03–0.10 g/l |

Instead of copper sulfate, other copper salts can be used at least partially. Sulfuric acid can be completely or partially replaced by fluoroboric acid, methane sulfonic acid or other acids. The chloride ions are added in the form of reagent-grade alkali chlorides (e.g. sodium chloride), or hydrochloric acid. Some or all of the sodium chloride does not have to be added when halogenide ions are already in the additives.

In addition, conventional brighteners, leveling agents, wetting agents or other conventional additives can be contained in the bath. To produce bright copper deposits with specific material properties, at least one water-soluble sulfur compound (preferably a water-soluble organic sulfur compound) and an oxygen-containing, high-molecular compound are added to the deposition bath. Additives such as nitrogen-containing sulfur compounds, polymer nitrogen compounds and/or polymer phenazonium compounds can also be used.

These individual components are present in the ready-for-use bath within the following concentration limits:

| Conventional oxygen-containg high-molecular compounds | 0.005–20 g/l |
|---|---|
| preferably | 0.01–5 g/l |
| Conventional water-soluble organic sulfur compounds | 0.0005–0.4 g/l |
| preferably | 0.001–0.15 g/l. |

Table 3 lists examples of oxygen-containing, high-molecular compounds. Table 4 contains a few useful sulfur compounds. Corresponding functional groups are contained in the compounds to provide water solubility.

Thiourea derivatives and/or polymer phenazonium compounds and/or polymer nitrogen compounds are used at the following concentrations:

|  | 0.0001–0.50 g/l |
|---|---|
| and preferably | 0.0005–0.04 g/l. |

To create the bath, the individual components are added to the basic composition. The operating conditions of the bath are as follows:

| pH: | <1, |
|---|---|
| Temperature: | 15° C.–50° C. |
| preferably | 25° C.–40° C. |
| Cathodic current density: | 0.5–12 A/dm$^2$ |
| and preferably | 3–7 A/dm$^2$. |

The pulsed current is created by a suitable pulse generator.

In the pulsed-current procedure, the current is set galvanostatically between the workpieces that are polarized as cathodes (such as printed circuit boards) and the anodes and modulated by suitable means. The voltage between the cathodes and anodes occurs automatically. In the pulsed-voltage procedure, a voltage is set potentiostatically between the workpieces and the anodes and modulated over time to produce a voltage that can be modulated over time. In this case, the current arises automatically.

The pulsed current generator can generate cathodic and anodic current pulses and can also briefly set the current to zero. The anodic pulses should be at least as strong as the cathodic pulses. The anodic pulses are preferably two-to-three times stronger than the cathodic current pulses. Overall, the charge that flows during the (cathodic) deposition phase should be much larger than the charge in the anodic phase.

The pulses should be 0.1 msec.–1 sec. Preferred pulse durations are 0.3 msec.–30 msec.; the cathodic pulses are preferably 10 msec.–30 msec., and the anodic current pulses are 0.3 msec.–10 msec. and especially 0.3 msec.–3 msec. A particularly favorable current modulation is as follows: The cathodic phase lasts 10 msec., and the anodic phase lasts 0.5 msec. The setting can be improved by putting a pause (5 msec) or an anodic pulse (1 msec.) between cathodic pulses (5 msec.). Several cathodic or anodic pulses can be set to different strengths in a cycle. Devices to create such types of modulation are prior art.

The deposition bath is moved by a strong incident flow and possibly by blowing in clean air to strongly agitate the bath surface. This maximizes the transport of materials to the cathodes and anodes so that higher current densities are possible. Moving the cathodes also helps transport substances to the respective surfaces. The higher convection and electrode movement produces a constant, diffusion-controlled deposition. The substrates can move horizontally, vertically and/or by vibration. It is particularly effective to both move the substrates and blow air into the deposition bath.

The copper consumed in the deposition process is replenished electrochemically by the copper anodes. Copper containing 0.02–0.067 percent by weight phosphorus is used for the anodes.

As needed, filters can be provided in the electrolyte circuits to remove mechanical and/or chemical residue. The need for filters is less in comparison to electrolytic cells with soluble anodes since the sludge arising from the phosphorus in the anodes is not formed.

Normally, coating systems are used in which the treated specimen is held vertically or horizontally during deposition. The procedure is preferably used to manufacture printed circuit boards. Another possibility is to copper-plate parts for decorative purposes such as sanitary appliances, automobile parts and furniture fittings.

The following examples and comparative examples serve to explain the invention:

Comparative Example 1

A copper bath with the following composition was used in an electrolyte cell with soluble, phosphorus-containing copper anodes:

80 g/l copper sulfate ($CuSO_4.5H_2O$),
180 g/l sulfuric acid (conc.),
0.08 g/l sodium chloride,
with the following brighteners:
1.5 g/l polypropylene glycol,
0.006 g/l 3-mercaptopropane-1-sulfonic acid, sodium salt,
0.001 g/l N-acetylthiourea.

Copper layers were deposited with a pulsed current on a brushed copper laminate at an electrolyte temperature of 25° C. within the following procedural parameters:

| Cathodic current: | strength: 4 A/dm$^2$ |
|---|---|
| duration: 10 msec., | |
| subsequent anodic current: | strength: 8 A/dm$^2$ |
| duration: 0.5 msec. | |

Copper layers with a rough, dull surface were obtained. The breaking elongation of such a deposited film was only 14%. A copper layer deposited on a printed circuit board manifested cracks at various sites after a single solder shock test of 10 sec. at 288° C. The copper layer therefore did not meet the desired quality standard.

Comparative Example 2

Comparative example 1 was repeated. However, the deposition in the bath was continued over a longer time, and then copper from this pre-used bath was deposited on a printed circuit board (charge flow rate: 20 A×h/l deposition bath). The appearance of the copper layer improved notably over that in the experiment in comparative example 1. The copper layer on the printed circuit board was bright and no longer rough. The breaking elongation of a layer from the pre-used bath improved to 18%.

EXAMPLE 1

At the beginning of deposition, an additional:
200 mg/l iron(II) sulfate pentahydrate
was added to the deposition bath from comparative example 1. A copper layer was created on a printed circuit board with freshly prepared bath, and the appearance of the copper layer on the first coated printed circuit board was surprisingly good (bright, no roughness). The breaking elongation was 20% after a charge flow rate of 1 A×h/l deposition bath. A printed circuit board coated with a copper layer deposited in this bath survived two solder shock tests of 10 sec. at 288° C. without observed cracks in the copper layer. The copper layer was uniformly bright.

Results from Comparative Examples 1 and 2, and Example 1

By adding iron(II) sulfate pentahydrate, the long preparation phase that always occurred when pulsed current was used could be eliminated. An optimally functioning deposition bath was obtained after a short bath preparation time after a current flow of 1–2 A×h/l deposition bath.

Comparative Example 3

PCBs were copper-plated in a deposition bath with the following composition in a production system for printed circuit boards:

80 g/l copper sulfate ($CuSO_4.5\ H_2O$),
200 g/l sulfuric acid (conc.)
The following was added as brighteners:
1.0 g/l polyethylene glycol,
0.01 g/l 3-(benzothiazolyl-2-thio)propylsulfonic acid, sodium salt
0.05 g/l acetamide
The copper layers were deposited using a pulsed current within the following parameters:

| 1. | Phase: cathodic current: | strength: 6 A/dm$^2$ |
|---|---|---|
| | duration: 5 msec | |
| 1. | Phase: no current: | strength 0 A/dm$^2$ |
| | duration 0.5 msec | |
| 1 | Phase: cathodic current: | strength: 6 A/dm$^2$ |
| | duration: 5 msec | |
| 1. | Phase: anodic current: | strength: 10 A/dm$^2$ |
| | duration: 1 msec. | |

At an electrolyte temperature of 34° C., copper layers were obtained on a brushed copper laminate with a dull surface that felt very rough. A printed circuit board with a copper coating from the same electrolyte did not survive two solder shock tests. The metal distribution in a 0.6-mm-diameter drilled hole was only 62%.

EXAMPLE 2

Then the following was added to the deposition bath from comparative example 3:

200 mg/l iron(III) chloride hexahydrate

At the first go copper layers were obtained with favorable visual and mechanical material properties. The copper surfaces were uniformly bright. No dendrites could be found under a microscope at 40× enlargement. A printed circuit board coated with these layers did not manifest any cracks after five solder shock tests. The metal distribution improved to 65%.

Results of Comparative Example 3 and Example 2

By adding iron ions, the insufficient visual and mechanical material properties of the copper layer were avoided.

All disclosed features and combinations of the disclosed features are the subject of this invention if not otherwise expressly identified as prior art.

Table 1: Iron Compounds

Iron(II) ethylenediammoniumsulfate tetrahydrate and its water-free form
Iron(II) acetate
Iron(II) bromide
Iron(II) carbonate
Iron(II) chloride tetrahydrate and its water-free form
Iron(II) fluoride tetrahydrate and its water-free form
Iron(II) fumarate
Iron(II) gluconate dihydrate and its water-free form
Iron(II) methane sulfonate
Iron(II) oxalate dihydrate and its water-free form
Iron(II) sulfate heptahydrate and its water-free form
Iron(II) tetrafluoroborate hexahydrate and its water-free form
Iron(III) chloride hexahydrate and its water-free form
Iron(III) citrate hydrate and its water-free form
Iron(III) fluoride trihydrate and its water-free form
Iron(III) perchlorate hydrate and its water-free form
Iron(III) phosphate
Iron(III) sulfate hydrate and its water-free form
Iron(III) sulfate pentahydrate and its water-free form Table 2: Additional Redox Compounds Cerium(IV) sulfate
Disodium hydrogen arsenate heptahydrate and its water-free form
Hexachloroplatinum(VI) acid hydrate and its water-free form
Cobalt(II) sulfate hydrate and its water-free form
Manganese(II) sulfate hydrate and its water-free form
Sodium chromate
Sodium metavanadate
Sodium metatungstenate
Sodium molybdate
Ruthenium(III) chloride
Samarium(III) chloride hexahydrate and its water-free form
Tetrachlorogold(III) acid hydrate and its water-free form
Titanylsulfuric acid
Titanium oxide sulfate sulfuric acid complex
Tin(II) sulfate Table 3: Oxygen-Containing High-Molecular Compounds Carboxymethylcellulose
Nonylphenol polyglycol ether
Octane diol-bis-(polyalkylene glycol ether)
Octanol polyalkylene glycol ether
Oleic acid polyglycol ester
Polyethylene propylene glycol
Polyethylene glycol
Polyethylene glycol dimethyl ether
Polyoxypropylene glycol
Polypropylene glycol
Polyvinyl alcohol
β-naphthol polyglycol ether
Stearic acid polyglycol ester
Stearyl alcohol polyglycol ether Table 4: Sulfur Compounds 3-(benzothiazolyl-2-thio) propylsulfonic acid, sodium salt
3-mercaptopropane-1-sulfonic acid, sodium salt
Ethylenedithiodipropylsulfonic acid, sodium salt
Bis-(p-sulfophenyl)disulfide, disodium salt
Bis-(ω-sulfobutyl)disulfide, disodium salt
Bis-(ω-sulfohydroxypropyl)disulfide, disodium salt
Bis-(ω-sulfopropyl)disulfide, disodium salt
Bis-(ω-sulfopropyl)sulfide, disodium salt
Methyl-(ω-sulfopropyl)disulfide, disodium salt
Methyl-(ω-sulfopropyl) trisulfide, disodium salt
O-Ethyl-dithiocarbonic acid-S-(ω-sulfopropyl) ester, potassium salt
Thioglycolic acid
Thiophosphoric acid-O-ethyl-bis-(ω-sulfopropyl)ester, disodium salt
Thiophosphoric acid-tris-(ω-sulfopropyl)ester, trisodium salt

What is claimed is:

1. A process to electrolytically deposit copper layers within a short preparation time with the following process steps:

a) Preparing a deposition bath containing copper ions, at least one compound that increases the electrical conductivity of the deposition bath, at least one additive to influence the material properties of the copper layers, at least one additional compound of an electrochemically reversible redox system, and a solvent or solvent mixture, b) Bringing an electrically-conductive substrate and at least one anode that disintegrates upon electrolytic deposition into contact with the deposition bath, c) Connecting the substrate and the anode to a power supply, and depositing the copper layers on the substrate using a pulsed current or pulsed voltage process.

2. The process according to claim 1, wherein said compounds of the electrochemically reversible redox system are selected from the group consisting of iron, arsenic, cerium, chromium, cobalt, gold, manganese, molybdenum, platinum, ruthenium, samarium, titanium, vanadium, tungsten and tin.

3. The process according to one of the preceding claims, characterized in that the deposition solution contains the compounds of the redox system at a concentration of 3–500 mg element/liter deposition bath, and preferably 25–100 mg element/Liter deposition bath.

4. The process according to claim 1, characterized in that to deposit the copper layers, sequential current and voltage pulses are set at different strengths in the substrate, and at least one of the pulses is cathodic and at least one of the pulses is anodic or set at zero.

5. The process according to claim 4, characterized in that the duration of a current or voltage pulse ranges from 0.3 milliseconds to 30 milliseconds.

6. The process according to claims 1–2 wherein the substrate is a printed circuit board.

7. The process according to claim 2, characterized in that to deposit the copper layers, sequential current and voltage pulses are set at different strengths in the substrate, and at least one of the pulses is cathodic and at least one of the pulses is anodic or set at zero.

8. The process according to claim 3, characterized in that to deposit the copper layers, sequential current and voltage pulses are set at different strengths in the substrate, and at least one of the pulses is cathodic and at least one of the pulses is anodic or set at zero.

9. The process according to claim 2, characterized in that the duration of a current or voltage pulse ranges from 0.3 milliseconds to 30 milliseconds.

10. The process according to claim 3, characterized in that the duration of a current or voltage pulse ranges from 0.3 milliseconds to 30 milliseconds.

11. The process according to claim 3, wherein the substrate is a printed circuit board.

12. The process according to claim 4, wherein the substrate is a printed circuit board.

13. The process according to claim 5, wherein the substrate is a printed circuit board.

* * * * *